US009431795B2

(12) United States Patent
Seki

(10) Patent No.: US 9,431,795 B2
(45) Date of Patent: Aug. 30, 2016

(54) LASER BEAM-COMBINING OPTICAL DEVICE

(71) Applicant: Mitsubishi Electric Corporation, Tokyo (JP)

(72) Inventor: Toshihide Seki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/470,361

(22) Filed: Aug. 27, 2014

(65) Prior Publication Data

US 2015/0236479 A1   Aug. 20, 2015

(30) Foreign Application Priority Data

Feb. 14, 2014   (JP) ................................. 2014-026069

(51) Int. Cl.
*H01S 5/40*   (2006.01)
*G02B 19/00*   (2006.01)

(52) U.S. Cl.
CPC ......... *H01S 5/4012* (2013.01); *G02B 19/0028* (2013.01); *G02B 19/0057* (2013.01); *H01S 5/4025* (2013.01)

(58) Field of Classification Search
CPC ............... H01S 5/4012; H01S 5/4025; G02B 19/0028; G02B 19/0057
USPC ....................................................... 359/641
See application file for complete search history.

(56) References Cited

U.S. PATENT DOCUMENTS

| 6,718,088 B2* | 4/2004 | Okazaki | G02B 6/4204 |
| | | | 372/6 |
| 7,502,176 B2* | 3/2009 | Mino | G02B 6/4214 |
| | | | 359/719 |
| 7,959,297 B2 | 6/2011 | Silverstein et al. | |
| 2006/0221454 A1* | 10/2006 | Matsushita | G11B 7/1376 |
| | | | 359/641 |
| 2009/0284713 A1 | 11/2009 | Silverstein et al. | |
| 2012/0133904 A1 | 5/2012 | Akiyama | |
| 2012/0162615 A1 | 6/2012 | Sawai | |
| 2014/0132937 A1 | 5/2014 | Daniels | |
| 2015/0303656 A1* | 10/2015 | Morita | H01S 5/143 |
| | | | 372/44.01 |

FOREIGN PATENT DOCUMENTS

| EP | 2458437 A1 | 5/2012 |
| JP | 2000-241659 A | 9/2000 |
| JP | 2002-202442 A | 7/2002 |
| JP | 2007-17925 A | 1/2007 |
| JP | 2011-523468 A | 8/2011 |

\* cited by examiner

*Primary Examiner* — Bumsuk Won
*Assistant Examiner* — Grant Gagnon
(74) *Attorney, Agent, or Firm* — Birch, Stewart, Kolasch & Birch, LLP

(57) ABSTRACT

A laser beam-combining optical device according to the present invention includes a plurality of semiconductor laser arrays, and a reflective element that reflects a laser light beam emitted from at least one semiconductor laser array of the plurality of semiconductor laser arrays. When laser light beams emitted from respective ones of the plurality of semiconductor laser arrays are focused on a single focus point, the laser light beam emitted from the at least one semiconductor laser array is reflected by the reflective element, and is then focused on the focus point.

7 Claims, 4 Drawing Sheets

F I G. 7
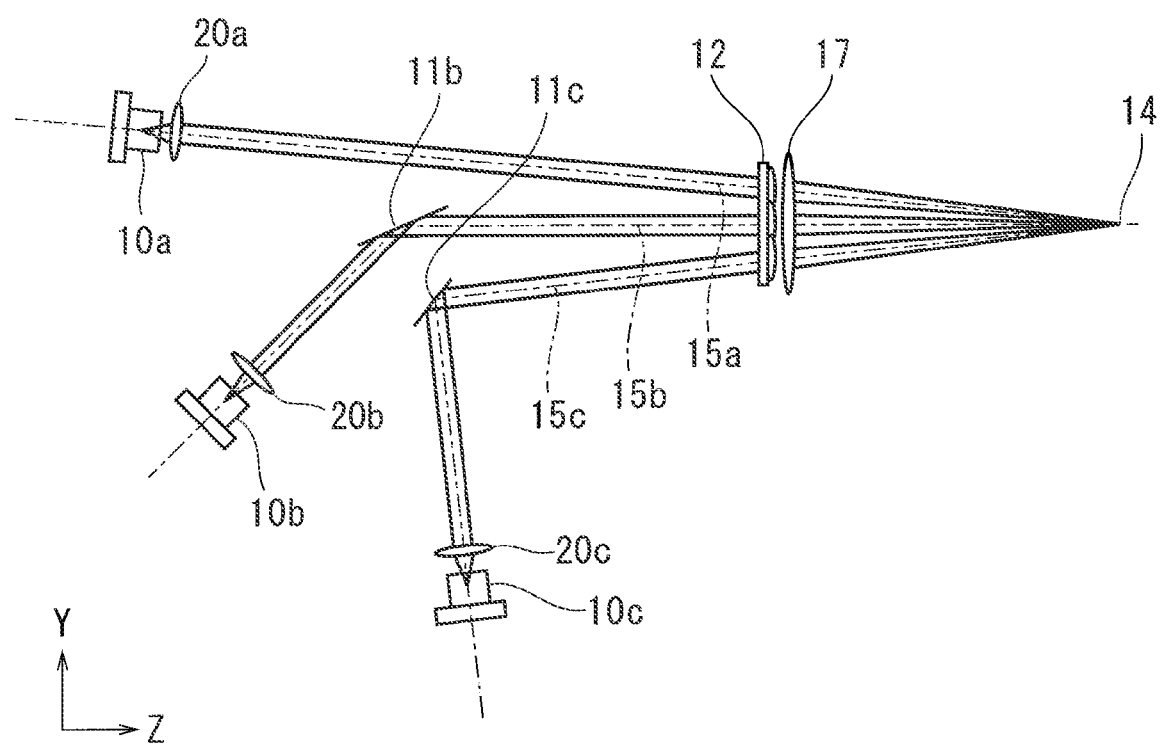

LASER BEAM-COMBINING OPTICAL DEVICE

BACKGROUND OF THE INVENTION

1. Field of the Invention

The present invention relates to a laser beam-combining optical device, and more particularly to a laser beam-combining optical device for combining a plurality of output light beams output from a multi-emitter laser having a plurality of light-emitting point sources.

2. Description of the Background Art

Conventionally, a projection-type display device such as a projector uses a high-pressure mercury lamp or the like as the light source. The emission spectrum of a lamp includes generally continuous visible light range depending on properties of a substance contained in the lamp. In order to create an optimum color for the display device, the emission spectrum of a lamp is separated into three colors: red, green, and blue. Small display devices are then irradiated by light of the respective colors, and light rays of the respective colors are combined together again on the screen. Thus, full-colored video is generated.

In recent years, projection-type display devices that use lasers as the light sources, instead of lamps such as high-pressure mercury lamps, have been actively studied. A projection-type display device that uses a laser as the light source uses monochromatic lasers as the light source, and therefore provides a wide range of color reproduction. Moreover, since laser light originates from a small light-emitting point source, the size of an entire optical system can be reduced. Furthermore, a red, green, and blue monochromatic light rays, for example, are emitted from a red, green, and blue lasers, respectively, and therefore there is no need for an optical system for separating colors in contrast to one that uses a lamp as the light source.

However, if only a single laser element is used as the light source of a projection-type display device, current technology cannot provide sufficient output power of the laser element. In particular, use of a projection-type display device in an application that involves projection of image light onto a large screen cannot provide a sufficient amount of light. Thus, means configured to include a plurality of single-emitter lasers each having a single light-emitting point source, and combine the output thereof to provide high output power is proposed, for example, in Japanese Patent Application Laid-Open No. 2000-241659.

Japanese Patent Application Laid-Open No. 2002-202442 proposes a method in which light rays from a single multi-emitter laser (also referred to as "semiconductor laser array") having a plurality of light-emitting point sources are collected and coupled into optical fiber.

Also, Japanese Patent Application Laid-Open No. 2007-17925 proposes a technique in which light beams from a plurality of lasers are aligned using polarization members, and are then collected and directed into optical fiber using a condenser lens.

However, Japanese Patent Application Laid-Open No. 2000-241659 described above provides different path lengths of laser light beams from respective laser elements to a condenser lens, and thus the radii of the light beams at the location of the condenser lens differ from one another. Therefore, it is difficult to obtain a sufficiently small focus point.

Japanese Patent Application Laid-Open No. 2002-202442 describes a configuration such that light rays from a single multi-emitter laser are collected. This configuration, however, creates difficulties in combining outputs of a plurality of multi-emitter lasers.

The light-collecting optical system of Japanese Patent Application Laid-Open No. 2007-17925 only has a function to combine light waves, and it is thus difficult to provide aberration correction, and also to reduce the radius of focus spot. In addition, appropriate aberration correction requires high accuracy in the shape and arrangement of the collimate lens. This presents a problem both in cost and in productivity.

SUMMARY OF THE INVENTION

It is an object of the present invention to provide a laser beam-combining optical device capable of combining laser light beams from a plurality of lasers with a simple configuration.

A laser beam-combining optical device according to the present invention includes a plurality of semiconductor laser arrays, and a reflective element configured to reflect a laser light beam emitted from at least one semiconductor laser array of the plurality of semiconductor laser arrays. When laser light beams emitted from respective ones of the plurality of semiconductor laser arrays are focused on a single focus point, the laser light beam emitted from the at least one semiconductor laser array is reflected by the reflective element, and is then focused on the focus point.

Focusing of laser light beams emitted from a plurality of semiconductor laser arrays on a focus point allows high density and high power laser light to be output. Moreover, changing the optical axis angle of a laser light beam by reflecting the laser light beam by a reflective element eliminates the need to arrange the plurality of semiconductor laser arrays in an adjacent manner. This increases flexibility in how the semiconductor laser arrays are arranged. Furthermore, adjustment of an angle of the reflective element allows the optical axis angle of the laser light beam to be arbitrarily adjusted.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a diagram illustrating a configuration of a laser beam-combining optical device according to a third preferred embodiment.

DESCRIPTION OF THE PREFERRED EMBODIMENTS

First Preferred Embodiment

<Configuration>

Figure 1:
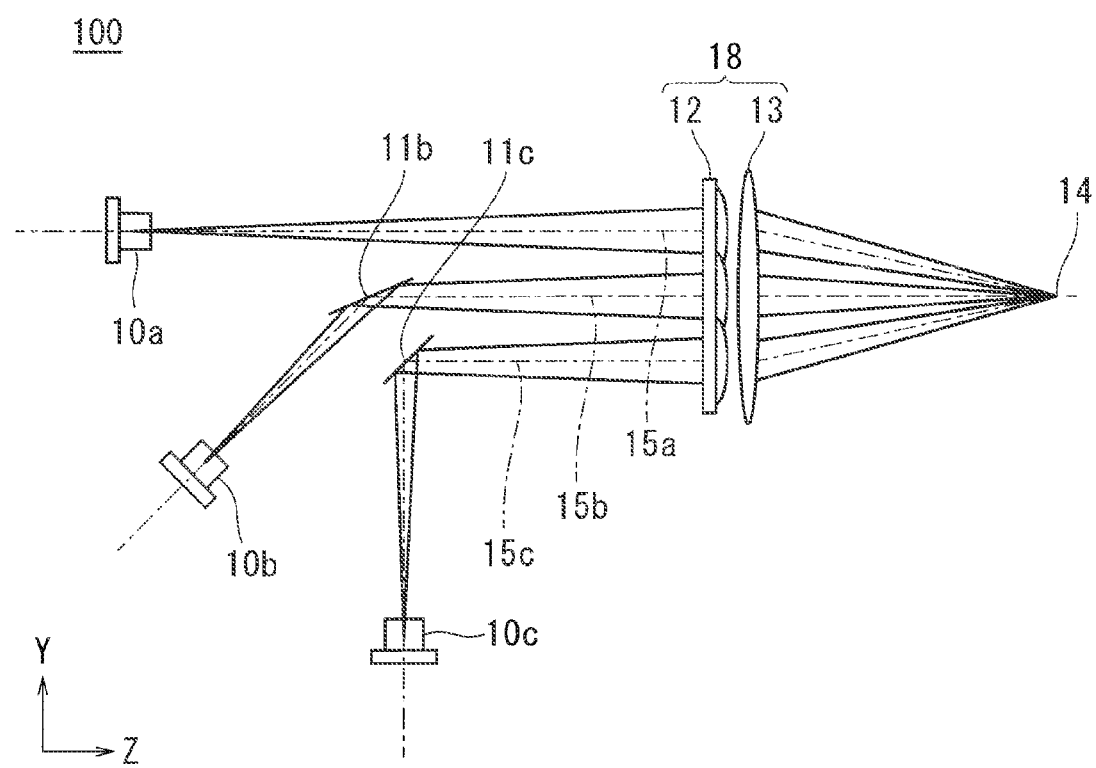
FIG. 1 is a diagram illustrating a configuration of a laser beam-combining optical device according to a first preferred embodiment.

FIG. 1 illustrates a configuration of a laser beam-combining optical device 100 according to this preferred embodiment. Arrangement of components is described below using the XYZ coordinate system shown in FIG. 1.

The laser beam-combining optical device 100 includes three semiconductor laser arrays (also referred to as "multi-emitter lasers") 10a, 10b, and 10c. As shown in FIG. 1, the semiconductor laser arrays 10a, 10b, and 10c are disposed in a same plane. As used herein, a same plane means a YZ plane having a particular value in the X-axis. The laser beam-combining optical device 100 further includes reflective elements 11b and 11c that reflect laser light beams from the semiconductor laser arrays 10b and 10c, respectively. The reflective elements 11b and 11c are, for example, mirrors.

The laser beam-combining optical device 100 further includes a condenser unit 18 that focuses, to a focus point 14, the laser light beams emitted from respective ones of the semiconductor laser arrays 10a, 10b, and 10c. The condenser unit 18 includes a lens array 12 and a condenser lens 13. The lens array 12 includes a plurality of condenser lens elements, each of which individually condenses the laser light beam emitted from a corresponding one of the semiconductor laser arrays 10a, 10b, and 10c. The plurality of condenser lens elements included in the lens array 12 are each either a spherical lens or a non-spherical lens.

The condenser lens 13 is provided on an output side of the lens array 12. The condenser lens 13 focuses, to the focus point 14, the plurality of laser light beams output from respective ones of the plurality of condenser lens elements of the lens array 12.

The optical axes 15a, 15b, and 15c shown in FIG. 1 are optical axes of the laser light beams emitted from the semiconductor laser arrays 10a, 10b, and 10c, respectively.

In the laser beam-combining optical device 100, the positions of the semiconductor laser arrays 10a, 10b, and 10c, and of the reflective elements 11b and 11c are determined so that the distances from respective ones of the semiconductor laser arrays 10a, 10b, and 10c to an incident surface of the condenser unit 18 (i.e., incident surface of the lens array 12) along the optical axes 15a, 15b, and 15c, respectively, of the laser light beams are substantially equal to one another. As used herein, an incident surface of the condenser unit 18 is the incident surface of the lens array 12.

Figure 2A:
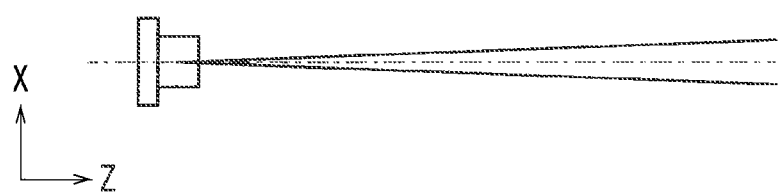
FIGS. 2A and 2B are each a diagram illustrating divergence of a laser light beam emitted by a typical laser element.
Figure 2B:
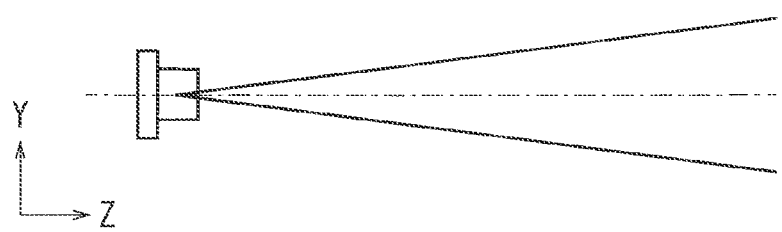

A laser light beam emitted from a typical semiconductor laser element has an output angle of the laser light beam that differs between a direction parallel to and a direction perpendicular to the active layer of the laser element. In FIGS. 2A and 2B, assuming that the active layer (not shown) is formed in parallel to the XZ plane, the output angle in the direction perpendicular to the active layer (FIG. 2B) is generally larger than the output angle in the direction parallel to the active layer (FIG. 2A).

Figure 3:
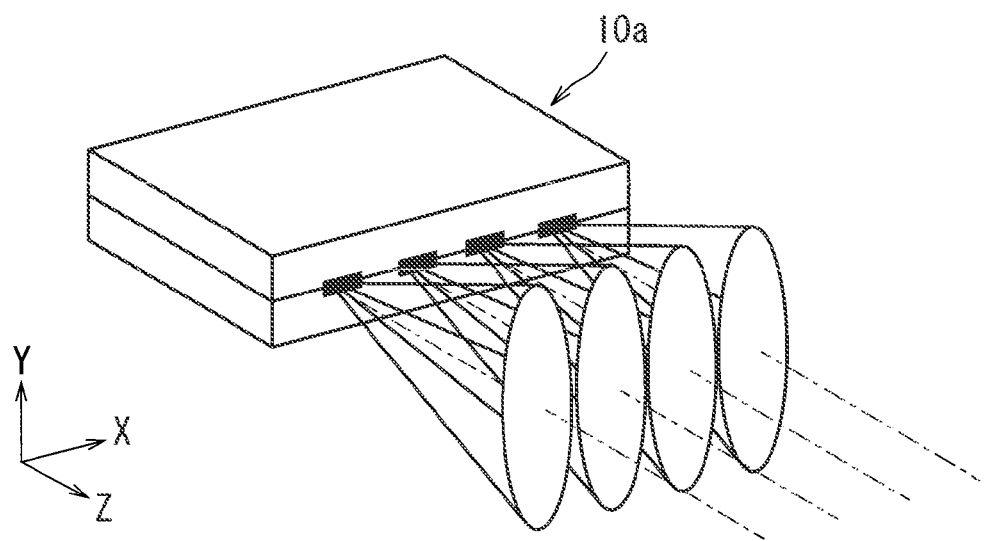
FIG. 3 is a perspective view of the semiconductor laser array according to the first preferred embodiment.

FIG. 3 is a perspective view of the semiconductor laser array 10a. Light-emitting point sources are disposed along the active layer (not shown) in the X direction equidistantly from one another, and an output light beam from each of the light-emitting point sources has an elliptical shape with its minor axis being in the direction (i.e., in the Y-axis direction) perpendicular to the active layer. That is, the semiconductor laser array 10a is arranged so that an array arrangement direction (i.e., direction in which the light-emitting point sources are arranged) is perpendicular to the YZ plane. Similarly, each of the semiconductor laser arrays 10b and 10c is arranged so that an array arrangement direction is perpendicular to the YZ plane.

In this preferred embodiment, the semiconductor laser arrays 10a, 10b, and 10c and the reflective elements 11b and 11c are arranged so that the laser light beams are input to the condenser unit 18 with the optical axes 15a, 15b, and 15c of the respective laser light beams being parallel to one another.

Figure 4:
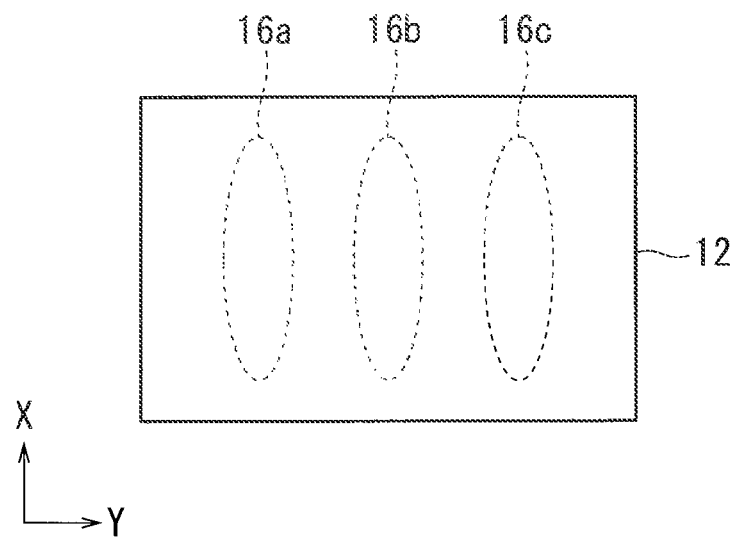
FIG. 4 is a cross-sectional view of laser light beams on an incident surface of a lens array of the laser beam-combining optical device according to the first preferred embodiment.

FIG. 4 illustrates a cross section of the laser light beams on an incident surface of the lens array 12 of the laser beam-combining optical device 100. Cross sections 16a, 16b, and 16c of the laser light beams emitted from the semiconductor laser arrays 10a, 10b, and 10c, respectively, have areas and shapes approximately equal to, and the same as, one another. This is because the distances from the semiconductor laser arrays 10a, 10b, and 10c to the incident surface of the lens array 12 along the optical axes 15a, 15b, and 15c, respectively, of the laser light beams are substantially equal to one another.

In FIG. 4, the cross sections 16a, 16b, and 16c of the respective laser light beams each have a minor radius in the X-axis direction because the array arrangement direction (i.e., direction in which the light-emitting point sources are arranged) in each of the semiconductor laser arrays 10a, 10b, and 10c is the X-axis direction.

As shown in FIG. 4, the plurality of laser light beams are incident upon the lens array 12 side by side in the Y-axis direction. In order that the laser light beams are efficiently collected by the lens array 12, it is preferred that the laser light beams not overlap with one another on the incident surface of the lens array 12. In this preferred embodiment, the distances from respective ones of the semiconductor laser arrays 10a, 10b, and 10c to the lens array 12 along the optical axes of the laser light beams are determined taking into consideration the output angle of the laser light beam in each of the semiconductor laser arrays 10a, 10b, and 10c so that the laser light beams do not overlap with one another on the incident surface of the lens array 12.

<Operation>

The laser light beams (corresponding to the optical axis 15a) emitted from the plurality of light-emitting point sources of the semiconductor laser array 10a are incident upon the lens array 12 of the condenser unit 18. The laser light beams emitted from the plurality of light-emitting point sources of the semiconductor laser array 10b are reflected by the reflective element 11b, thereby having its angle of the optical axis 15b being changed, and are then incident upon the lens array 12 of the condenser unit 18. The laser light beams emitted from the plurality of light-emitting point sources of the semiconductor laser array 10c are reflected by the reflective element 11c, thereby having its angle of the optical axis 15c being changed, and are then incident upon the lens array 12 of the condenser unit 18. In this regard, the cross sections of the laser light beams emitted from the semiconductor laser arrays 10a, 10b, and 10c each have an elliptical shape with its minor axis being in the X-axis direction (i.e., direction into the paper in FIG. 1). In addition, the optical axes 15a, 15b, and 15c of the respective laser light beams incident upon the lens array 12 are parallel to one another.

In the lens array 12, each of the laser light beams is individually condensed along the X-axis direction. Each of the laser light beams output from the lens array 12 is incident upon the condenser lens 13. Each of the laser light beams incident upon the condenser lens 13 is focused on the focus point 14.

Note that although the lens array 12 of this preferred embodiment includes the condenser lens elements only on the light output surface, disposing condenser lens elements on both the incident surface and the output surface allows light collection performance to be further improved. Moreover, aberration correction can be provided by additionally disposing and using a cylindrical lens having a curvature in the YZ plane in front of the lens array 12, and hence making the shapes of the cross sections 16a, 16b, and 16c of the respective laser light beams more circular.

<Advantages>

A laser beam-combining optical device 100 according to this preferred embodiment includes a plurality of semiconductor laser arrays 10a, 10b, and 10c, and a reflective element 11b and/or 11c that reflects a laser light beam emitted from at least one semiconductor laser array 10b and/or 10c of the plurality of semiconductor laser arrays 10a, 10b, and 10c, characterized in that when laser light beams emitted from respective ones of the plurality of semiconductor laser arrays 10a, 10b, and 10c are focused on a single focus point 14, the laser light beam emitted from the at least one semiconductor laser array 10b and/or 10c is reflected by the reflective element 11b and/or 11c, and is then focused on the focus point 14.

Thus, the laser beam-combining optical device 100 according to this preferred embodiment focuses, to the focus point 14, the laser light beams emitted from the plurality of semiconductor laser arrays 10a, 10b, and 10c, and thereby allows high density and high power laser light to be output. Moreover, changing the optical axis angles of the laser light beams by reflecting the laser light beams by the reflective elements 11b and 11c eliminates the need to arrange the plurality of semiconductor laser arrays 10a, 10b, and 10c in an adjacent manner. This increases flexibility in how the semiconductor laser arrays are arranged. Furthermore, adjustment of angles of the reflective elements 11b and 11c allows the optical axis angles of the laser light beams to be arbitrarily adjusted.

Improvement in flexibility in disposing the semiconductor laser arrays and in the optical axis angles of the laser elements allows the distances from respective ones of the semiconductor laser arrays 10a, 10b, and 10c to the incident surface of the condenser unit 18 along the optical axes of the laser light beams to be substantially equal to one another. This makes the beam radii of the plurality of laser light beams incident upon the condenser unit 18 substantially equal to one another. Thus, the beam radii of the plurality of laser light beams to be focused on the focus point 14 can be reduced with a simple configuration.

The laser beam-combining optical device 100 according to this preferred embodiment further includes a condenser unit 18 that focuses, to the focus point 14, the laser light beams emitted from respective ones of the semiconductor laser arrays 10a, 10b, and 10c, between the reflective element 11b or 11c and the focus point 14, characterized in that the distances from respective ones of the plurality of semiconductor laser arrays 10a, 10b, and 10c to the incident surface of the condenser unit 18 along the optical axes of the laser light beams are equal to one another.

Thus, the beam radii of the respective incident laser light beams (i.e., the cross-sectional shapes of the respective incident laser light beams) are substantially the same on the incident surface of the condenser unit 18. This allows the condenser unit 18 to focus the laser light beams with a simpler configuration than when the beam radii of the respective incident laser light beams differ from one another. In addition, aberration that is introduced in an optical system in the condenser unit 18 can be reduced or prevented. Moreover, adding a function to correct aberration to the condenser unit 18 will facilitate aberration correction.

The laser beam-combining optical device 100 according to this preferred embodiment is characterized in that the condenser unit 18 includes a lens array 12 having a plurality of condenser lens elements, each of which individually condenses the laser light beam emitted from a corresponding one of the plurality of semiconductor laser arrays 10a, 10b, and 10c, and a condenser lens 13 provided on an output side of the lens array 12, which condenser lens 13 focuses, to the focus point 14, the plurality of laser light beams emitted from respective ones of the plurality of condenser lens elements of the lens array 12, and the distances from respective ones of the plurality of semiconductor laser arrays 10a, 10b, and 10c to the incident surface of the lens array 12 along the optical axes of the laser light beams are equal to one another.

Thus, the beam radii of the respective incident laser light beams become substantially equal to one another on the incident surface of the lens array 12. This allows the lens radius of the plurality of condenser lens elements included in the lens array 12 to be substantially equal to one another. In addition, the lens array 12 condenses each of the laser light beams individually first, and then the condenser lens 13 focuses the output laser light beams on the focus point 14. Thus, aberration that is introduced in the condenser lens 13 can be reduced or prevented in contrast to when light is collected and focused by only the condenser lens 13.

The laser beam-combining optical device 100 according to this preferred embodiment is characterized in that the plurality of semiconductor laser arrays 10a, 10b, and 10c are disposed in a same plane, and in each of the plurality of semiconductor laser arrays 10a, 10b, and 10c, an array arrangement direction of the semiconductor laser array is perpendicular to the same plane.

Thus, arrangement in which the array arrangement direction of the corresponding one of the semiconductor laser arrays is perpendicular to the same plane (i.e., the plane in which the semiconductor laser arrays 10a, 10b, and 10c are disposed) in each of the plurality of semiconductor laser arrays 10a, 10b, and 10c allows the space between each pair of the laser light beams to be reduced as compared with arrangement in which the array arrangement directions are parallel to the same plane. This can achieve size reduction of the condenser unit 18 (i.e., the lens array 12 and the condenser lens 13). Moreover, arrangement in which the array arrangement direction of the corresponding one of the semiconductor laser arrays is perpendicular to the same plane in each of the plurality of semiconductor laser arrays 10a, 10b, and 10c allows the space between each pair of the laser light beams to be reduced, and hence the space between each pair of the laser light beams incident upon the condenser lens 13 is also reduced. Thus, aberration that is introduced in the condenser lens 13 during focusing can be reduced or prevented.

Second Preferred Embodiment

Figure 5:
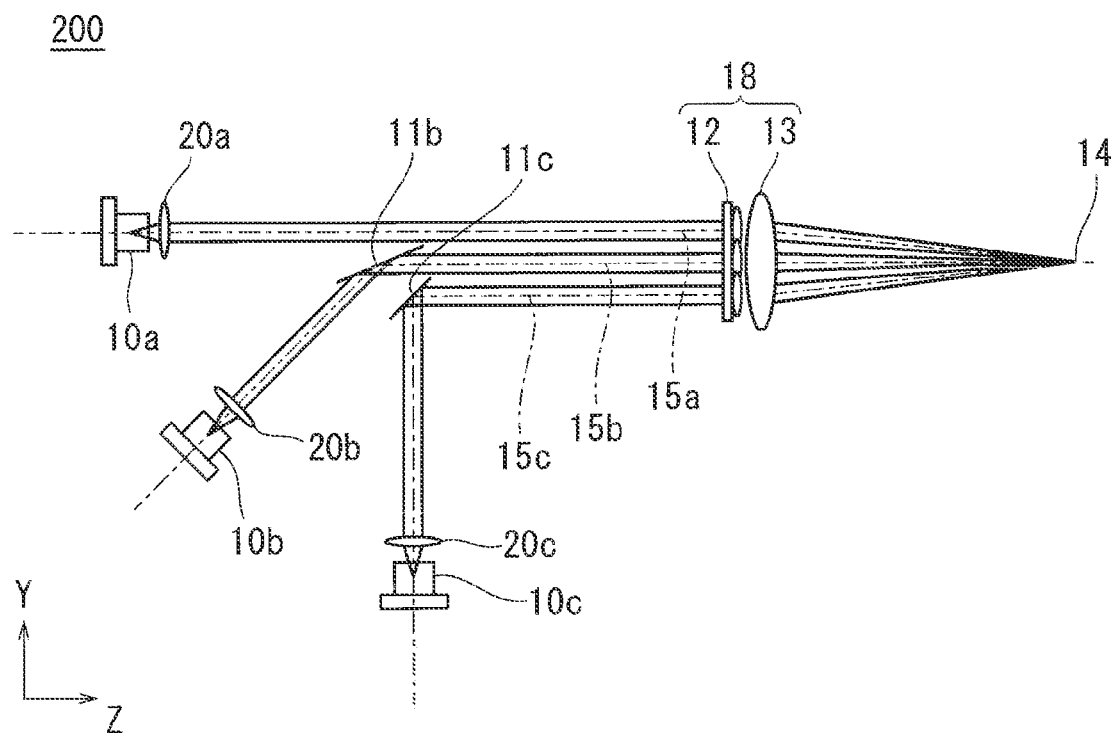
FIG. 5 is a diagram illustrating a configuration of a laser beam-combining optical device according to a second preferred embodiment.

FIG. 5 illustrates a configuration of a laser beam-combining optical device 200 according to this preferred embodiment. In the first preferred embodiment, the radii of the lens array 12 and of the condenser lens 13 of the condenser unit 18, and the installation space between each pair of the semiconductor laser arrays 10a, 10b, and 10c are restricted by the beam radii of the laser light beams emitted from the semiconductor laser arrays 10a, 10b, and 10c, respectively.

The laser beam-combining optical device 200 according to this preferred embodiment further includes lenses 20a, 20b, and 20c that collimate the laser light beams, on the output surface sides relative to the semiconductor laser arrays 10a, 10b, and 10c, respectively. The other portions of the configuration are the same as those of the first preferred embodiment, and the explanation thereof is omitted.

In FIG. 5, the lenses 20a, 20b, and 20c disposed immediately downstream of the semiconductor laser arrays 10a, 10b, and 10c, respectively, are each a cylindrical lens having a curvature in the YZ plane. Each of the laser light beams collimated in the YZ plane by the lenses 20a, 20b, and 20c is incident directly, or via the reflective element 11b or 11c, upon the condenser unit 18 as described in the first preferred embodiment.

Figure 6:
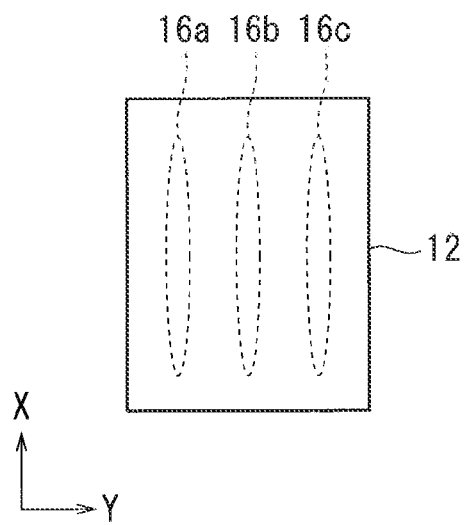
FIG. 6 is a cross-sectional view of laser light beams on an incident surface of a lens array of the laser beam-combining optical device according to the second preferred embodiment.

FIG. 6 is a cross-sectional view of the laser light beams on the incident surface of the lens array 12 of the laser beam-combining optical device 200 according to this preferred embodiment. As shown in FIG. 6, the radius of each of the laser light beam is reduced in the Y-axis direction. The reason why the beam radii of the laser light beams are reduced in the Y-axis direction is because the lenses 20a, 20b, and 20c are disposed immediately downstream of the semiconductor laser arrays 10a, 10b, and 10c, respectively. A reduction in the beam radius of each of the laser light beams incident upon the lens array 12 in the Y-axis direction allows the space between each pair of the optical axes 15a, 15b, and 15c of the laser light beams to be further reduced. Thus, the size of an entire optical system can be reduced as compared to that of the first preferred embodiment. In particular, the sizes of the lens array 12 and of the condenser lens 13 can be reduced in the Y-axis direction.

In addition, since the space between each pair of the optical axes 15a, 15b, and 15c of the laser light beams can be further reduced, the total angle of the laser light beams focused on the focus point 14 in this preferred embodiment (FIG. 5) is smaller than that in the first preferred embodiment (FIG. 1). This contributes to a size reduction of an optical system disposed beyond the focus point 14.

In this preferred embodiment, the small beam radii of the respective laser light beams allow aberration that is introduced in the condenser lens 13 to be reduced or prevented. Thus, even if the distance from the condenser lens 13 to the focus point 14 is made smaller (that is, the focal length of the condenser lens 13 is shorter) than that of the first preferred embodiment (FIG. 1), increases in the beam radii of the laser light beams at the focus point 14 due to an increase in the amount of aberration can be reduced or prevented. Accordingly, the laser beam-combining optical device 200 according to this preferred embodiment can be used in conjunction with a transmission optical element such as optical fiber in such a manner that, for example, the laser light beams focused on the focus point 14 are directed into the optical fiber.

Note that although the lenses 20a, 20b, and 20c have been described as cylindrical lenses in this preferred embodiment, the lenses 20a, 20b, and 20c may each be replaced by a combination of a cylindrical lens and either a spherical lens or a non-spherical lens. This configuration can reduce the radii of the laser light beams not only in the Y-axis direction but also in the X-axis direction in FIG. 6. A reduction in the radius of each of the laser light beams also in the X-axis direction can achieve a size reduction of the entire apparatus as well. A similar effect can be obtained by disposing two cylindrical lenses in combination having curvatures in directions perpendicular to each other.

Each of the lenses 20a, 20b, and 20c may have a form of lens array. In this case, the lens array may be incorporated in each of the semiconductor laser arrays 10a, 10b, and 10c.

<Advantages>

The laser beam-combining optical device 200 according to this preferred embodiment further includes lenses 20a, 20b, and 20c that collimate or collect the laser light beams on the output surface sides relative to the plurality of semiconductor laser arrays 10a, 10b, and 10c, respectively.

Thus, providing the lenses 20a, 20b, and 20c that collimate or collect the laser light beams on the output surface sides relative to the semiconductor laser arrays 10a, 10b, and 10c, respectively, can reduce the beam radii of the respective laser light beams. A reduction in the beam radius of each of the laser light beams allows the size of the condenser unit 18 to be reduced. In addition, since the space between each pair of the optical axes of the respective laser light beams can be further reduced, the size of the laser beam-combining optical device 200 itself can be reduced. Moreover, since the space between each pair of the optical axes of the respective laser light beams can be further reduced, aberration that is introduced in the condenser unit 18 can be reduced or prevented. This can further reduce the beam radii of the laser light beams focused on the focus point 14.

Third Preferred Embodiment

FIG. 7 illustrates a configuration of a laser beam-combining optical device 300 according to this preferred embodiment. In the laser beam-combining optical device 300 of this preferred embodiment, the optical axes 15a, 15b, and 15c of the laser light beams emitted from the semiconductor laser arrays 10a, 10b, and 10c, respectively, intersect at the focus point 14.

That is, the laser light beam emitted from the semiconductor laser array 10a reaches the focus point 14 without changing the angle of the optical axis. The laser light beam emitted from the semiconductor laser array 10b reaches the focus point 14 without changing the angle of the optical axis after being reflected by the reflective element 11b. Similarly, the laser light beam emitted from the semiconductor laser array 10c reaches the focus point 14 without changing the angle of the optical axis after being reflected by the reflective element 11c.

In the second preferred embodiment, the laser light beams are focused on the focus point 14 by means of the condenser lens 13. In contrast, in this preferred embodiment, the semiconductor laser arrays 10a, 10b, and 10c and the reflective elements 11b and 11c are arranged so that the optical axes 15a, 15b, and 15c of the respective laser light beams intersect at the focus point 14, and therefore the condenser lens 13 is not needed.

In this preferred embodiment, an aberration correction lens 17 is provided in place of the condenser lens 13 in the second preferred embodiment. The aberration correction lens 17 corrects aberration that is introduced by the lens array 12. The other portions of the configuration are the same as those of the second preferred embodiment (FIG. 5), and the explanation thereof is omitted.

Note that the configuration may be such that either one or both of the lens array 12 and the aberration correction lens 17 is not provided depending on the demand of an optical system disposed beyond the focus point 14.

<Advantages>

The laser beam-combining optical device 300 according to this preferred embodiment is characterized in that the distances from the plurality of semiconductor laser arrays 10a, 10b, and 10c to the focus point 14 along the optical axes 15a, 15b, and 15c, respectively, of the laser light beams are equal to one another, and the laser light beams reflected by the reflective element 11b or 11c reach the focus point 14 without changing angles of the optical axes 15b and 15c of the laser light beams after being reflected by the reflective element 11b or 11c, while the laser light beam not reflected by the reflective element 11b or 11c reaches the focus point 14 without changing an angle of the optical axis 15a of the laser light beam after being emitted from the semiconductor laser array 10a.

Thus, in the laser beam-combining optical device 300 according to this preferred embodiment, the semiconductor laser arrays 10a, 10b, and 10c and the reflective elements 11b and 11c are arranged so that the optical axes 15a, 15b, and 15c of the respective laser light beams intersect at the focus point 14, and therefore the condenser lens 13 is not needed. Accordingly, a reduction in the number of components can simplify the configuration of the laser beam-combining optical device 300. In addition, focusing without using the condenser lens 13 makes it less likely that aberration is introduced. Thus, the radii of the laser light beams focused on the focus point 14 can be smaller than those of a laser beam-combining optical device that uses the condenser lens 13.

In addition, the laser beam-combining optical device 300 according to this preferred embodiment further includes, before the focus point 14, an aberration correction lens 17 that corrects aberration in the laser light beams.

Thus, correction of aberration that is introduced in the lens array 12, by the aberration correction lens 17, can further reduce the radii of the laser light beams focused on the focus point 14.

While the invention has been shown and described in detail, the foregoing description is in all aspects illustrative and not restrictive. It is therefore understood that numerous modifications and variations can be devised without departing from the scope of the invention.

What is claimed is:

1. A laser beam-combining optical device comprising:
   a plurality of semiconductor laser arrays;
   a reflective element configured to reflect a laser light beam emitted from one semiconductor laser array of said plurality of semiconductor laser arrays; and
   a condenser unit configured to focus, to a focus point, the laser light beams emitted from respective ones of said plurality of semiconductor laser arrays, between said reflective element and said focus point,
   wherein
   when laser light beams emitted from respective ones of said plurality of semiconductor laser arrays are focused on a single focus point, the laser light beam emitted from said semiconductor laser array is reflected by said reflective element, and is then focused on said focus point,
   distances from respective ones of said plurality of semiconductor laser arrays to said focus point along optical axes of the laser light beams are equal to one another,
   the laser light beam reflected by said reflective element reaches said focus point without changing an angle of the optical axis of the laser light beam after being reflected by said reflective element,
   the laser light beam not reflected by said reflective element reaches said focus point without changing an angle of the optical axis of the laser light beam after being emitted from a corresponding one of said plurality of semiconductor laser arrays, and
   distances from respective ones of said plurality of semiconductor laser arrays to an incident surface of said condenser unit along optical axes of the laser light beams are equal to one another.

2. The laser beam-combining optical device according to claim 1, further comprising:
   before said focus point, an aberration correction lens configured to correct aberration in the laser light beams.

3. The laser beam-combining optical device according to claim 1, wherein
   said plurality of semiconductor laser arrays are disposed in a same plane, and
   in each of said plurality of semiconductor laser arrays, an array arrangement direction of said semiconductor laser array is perpendicular to said same plane.

4. The laser beam-combining optical device according to claim 1 further comprising:
   lenses configured to collimate or collect the laser light beams on respective output surface sides relative to said plurality of semiconductor laser arrays.

5. The laser beam-combining optical device according to claim 1, wherein
   said condenser unit includes
   a lens array having a plurality of condenser lens elements, each configured to individually condense the laser light beam emitted from a corresponding one of said plurality of semiconductor laser arrays, and
   a condenser lens provided on an output side of said lens array, and configured to focus, to said focus point, said plurality of laser light beams emitted from respective ones of said plurality of condenser lens elements of said lens array, and
   the distances from respective ones of said plurality of semiconductor laser arrays to an incident surface of said lens array along the optical axes of the laser light beams are equal to one another.

6. The laser beam-combining optical device according to claim 5, wherein
   said plurality of semiconductor laser arrays are disposed in a same plane, and
   in each of said plurality of semiconductor laser arrays, an array arrangement direction of said semiconductor laser array is perpendicular to said same plane.

7. The laser beam-combining optical device according to claim 5 further comprising:
   lenses configured to collimate or collect the laser light beams on respective output surface sides relative to said plurality of semiconductor laser arrays.

* * * * *